(12) United States Patent
Flanders

(10) Patent No.: US 6,345,059 B1
(45) Date of Patent: *Feb. 5, 2002

(54) SHORT CAVITY TUNABLE LASER WITH MODE POSITION COMPENSATION

(75) Inventor: Dale C. Flanders, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/696,405

(22) Filed: Oct. 25, 2000

(51) Int. Cl.[7] .................................................. H01S 3/10
(52) U.S. Cl. ........................ 372/20; 372/43; 372/28; 372/19; 372/98; 372/92; 372/99
(58) Field of Search ........................... 372/20, 43, 29, 372/92, 26, 28, 19, 98

(56) References Cited

U.S. PATENT DOCUMENTS

| | | | |
|---|---|---|---|
| 5,949,801 A | * | 9/1999 | Tayebati ........................ 372/20 |
| 6,108,355 A | | 8/2000 | Zorabedian ................... 372/20 |
| 6,122,301 A | * | 9/2000 | Tei et al. ........................ 372/29 |

* cited by examiner

Primary Examiner—Leon Scott, Jr.
(74) Attorney, Agent, or Firm—J. Grant Houston

(57) ABSTRACT

A semiconductor tunable laser system includes a tunable Fabry-Perot cavity and a cavity length modulator, which controls an optical length of the cavity at least over a distance corresponding to the spacings between the longitudinal modes of the laser cavity. Thus, the tunable Fabry-Perot cavity allows the laser cavity to have gain at the desired wavelength of operation while the cavity length modulator tunes the cavity length such that a longitudinal cavity mode exists at the desired wavelength of operation. Also, in one embodiment, a wavelength locker system is further provides that has a differential wavelength filter, e.g., stepped etalon, and a multi-element detector, e.g., a quad-detector. The controller then modulators the Fabry-Perot cavity to control the wavelength in response to the signal received from the multi-element detector.

37 Claims, 12 Drawing Sheets

ND MODE POSITION COMPENSATION

SHORT CAVITY TUNABLE LASER WITH MODE POSITION COMPENSATION

BACKGROUND OF THE INVENTION

Wavelength division multiplexing (WDM) systems typically comprise multiple separately modulated laser systems at the transmitter. These laser systems are designed or actively tuned to operate at different wavelengths. When their emissions are combined in an optical fiber, the resulting WDM optical signal has a corresponding number of spectrally separated channels. Along the transmission link, the channels are typically collectively amplified in semiconductor amplifier systems or gain fiber, such as erbium-doped fiber and/or regular fiber, in a Raman amplification scheme, although semiconductor optical amplifiers are also used in some situations. At the receiving end, the channels are usually separated from each other using, for example, thin film filter systems to thereby enable detection by separate detectors, such as photodiodes.

The advantage of WDM systems is that the transmission capacity of a single fiber can be increased. Historically, only a single channel was transmitted in each optical fiber. In contrast, modern WDM systems contemplate hundreds of spectrally separated channels per fiber. This yields concomitant increases in the data rate capabilities of each fiber. Moreover, the cost per bit of data in WDM systems is typically less than comparative non-multiplexed systems. This is because optical amplification systems required along the link is shared by all of the separate wavelength channels transmitted in the fiber. With non-multiplexed systems, each channel/fiber would require its own amplification system.

Nonetheless, there are challenges associated with implementing WDM systems. First, the transmitters and receivers are substantially more complex since, in addition to the laser diodes and receivers, optical components are required to combine the channels into, and separate the channels from, the WDM optical signal. Moreover, there is the danger of channel drift where the channels lose their spectral separation and overlap each other. This interferes with channel separation and demodulation at the receiving end.

Minimally, the optical signal generators, e.g., the semiconductor laser systems that generate each of the optical signals corresponding to the optical channels for a fiber link, must have some provision for wavelength control. Especially in systems with center-to-center wavelength channel spacings of less than 1 nanometer (nm), the optical signal generator must have a precisely controlled carrier wavelength. Any wander impairs the demodulation of the wandering signal at the far end receiver since the wavelength is now at a wavelength different than expected by the corresponding optical signal detector, and the wandering signal can impair the demodulation of spectrally adjacent channels when their spectrums overlap each other.

In addition to wavelength stability, optical signal generators that are tunable are also desirable for a number of reasons. First, from the standpoint of manufacturing, a single system can function as the generator for any of the multiple channel wavelength slots, rather than requiring different, channel slot-specific systems to be designed, manufactured, and inventoried for each of the hundreds of wavelength slots in a given WDM system. From the standpoint of the operator, it would be desirable to have the ability to receive some wavelength assignment, then have a generator produce the optical signal carrier signal into that channel assignment on-the-fly. Finally, in higher functionality systems such as wavelength add/drop devices, wavelength tunability is critical to facilitate dynamic wavelength routing, for example.

SUMMARY OF THE INVENTION

As tunable laser systems become more integrated and physically compact, a problem arises in that the spacing between the longitudinal laser cavity modes can be on the order of the proposed spectral spacings between channels. As a result, even if a given laser system can be tuned to have gain at the allocated channel wavelength, a longitudinal cavity mode for the laser cavity may not exist at that desired wavelength. In other words, two things must co-exist for a laser to generate light at the desired wavelength: 1) the cavity must have gain at that wavelength; and 2) the cavity must also have a longitudinal mode corresponding to the wavelength. Conventional lasers for WDM systems typically do not have provisions for tuning the cavity length to shift a cavity mode to the desired wavelength, actively.

In general, according to one aspect, the invention features a semiconductor tunable laser system. The system has a semiconductor chip, which functions as a laser gain medium within the laser cavity. A tunable Fabry-Perot filter is also provided within the laser cavity for selecting a wavelength of operation of the laser system. Finally, a cavity length modulator is included to modulate an optical length of the laser cavity at least over a distance corresponding to the spacings between the longitudinal modes of the laser cavity. Thus, according to the present invention, the tunable Fabry-Perot filter allows the laser cavity to have gain at the desired wavelength of operation, while the cavity length modulator tunes the laser cavity length such that a longitudinal cavity mode exists at the desired wavelength of operation.

According to the preferred embodiment, a controller is further provided that collectively tunes the Fabry-Perot laser to the desired wavelength of operation, and then controls the cavity length modulator so that a longitudinal mode of the cavity is controlled to reside at the desired wavelength of operation.

Further, in the preferred embodiment, the semiconductor chip comprises a semiconductor optical amplifier chip that functions as the laser gain medium. Further, according to the preferred embodiment, the tunable Fabry-Perot cavity comprises serial first and second partial reflectors and some means for changing an optical distance between the two reflectors. In the present implementation, an electrostatic deflection system is used whereby one of the reflectors is moveable and the controller modulates an electrical field between electrodes on the stationary and moveable reflectors to thereby change the distance between the stationary reflector and the movable reflector.

An electrostatic system is also preferably used to modulate the laser cavity length. In the present implementation, a movable, reflective membrane defines one end of the cavity. An electrostatic field controls the distance between the moveable membrane and a stationary electrode.

Preferably, the tunable laser system is integrated into a single hermetically sealed package. Specifically, the semiconductor chip, tunable Fabry-Perot filter, and the cavity length modulator are then attached or bonded to an optical bench, which is sealed within the package. As is common, a fiber pigtail enters the package via a fiber feed-through to connect and terminate above the bench to receive the laser beam from the laser cavity.

In the preferred embodiment, a wavelength locker system is further used. It has a differential wavelength filter and a multi-element detector. The controller then modulates the Fabry-Perot cavity to control the wavelength in response to the signal received from the multi-element detector.

In general, according to another aspect, the invention can also be characterized as a process for tuning a semiconductor laser system. This process comprises amplifying optical energy in a laser cavity with a semiconductor laser gain medium and then selecting a wavelength of operation of the laser cavity by tuning a Fabry-Perot filter within the laser cavity. Further, an optical length of the laser cavity is modulated over about the spacing between the longitudinal cavity modes. As described previously, the length can be tuned so that a cavity mode resides at the desired wavelength of operation.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
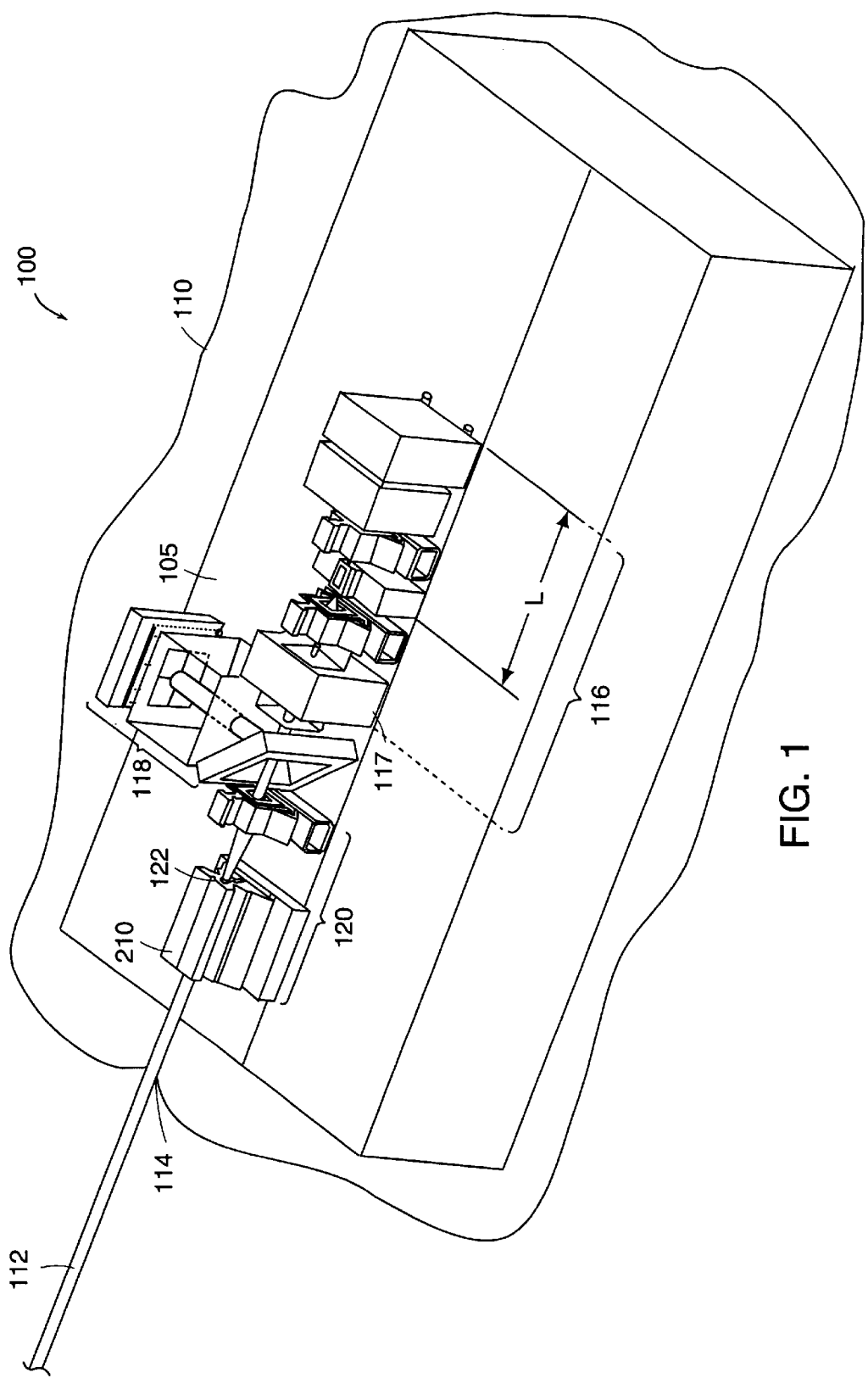
FIG. 1 is a perspective view of a tunable laser system of the present invention.

FIG. 1 shows a tunable laser system 100, which has been constructed according to the principles of the present invention.

Generally, the tunable laser system 100 comprises a hermetic package 110. Typically, this hermetic package is a standard pin package, such as a butterfly package or dual, in-line (DIP) package. Presently, a standard sized packaging platform is used, which has a hermetic cavity of less than 2.0 centimeters (about 0.75 inches) in length and less than 1.5 centimeters (cm) (approximately 0.5 inches) in width.

An optical bench or submount 105 is installed within the hermetic package 110. The optical components of the tunable laser system 100 are installed on this bench. In the preferred embodiment, the bench is constructed from a mechanically and temperature stable substance, such as aluminum nitride, silicon, silicon oxide, or beryllium oxide in various implementations. The bench is typically installed in the package on a thermo-electric cooler.

An optical fiber pigtail, such as a length of single mode optical fiber, 112, enters the hermetic package 110 through a fiber feed-through 114. Typically, the pigtail 112 passes through a ferrule in the feed-through. In one implementation, single mode polarization-maintaining fiber is used.

The termination or endface 122 of the fiber pigtail 112 is installed or attached to the bench 105 using a fiber mounting and alignment structure 210. This mounting structure 210 connects the fiber pigtail 112 such that the endface 122 is secured in a rigid connection to the bench 105 and supported above the bench. The optical signal is coupled into this fiber pigtail 112 via the fiber endface 122 and transmitted outside of the tunable laser system 110. Preferably, deformable mounting structures are used to enable active or passive alignment during system manufacture or calibration after an in-service period.

The optical components of the tunable laser system 100 are divided into three subsystems. The tunable semiconductor laser 116 generates the optical signal in the form of an output beam. A wavelength locker subsystem 118 determines a wavelength of the optical signal using a portion light, preferably from the output beam, from the tunable laser 116. The output coupling section 120 couples the remainder, or main portion, of the optical signal beam into the fiber pigtail 112 for transmission out of the system 100. An isolator 117 of the tunable laser 116 is preferably installed between the laser and the output coupling section 120/locker 118. This isolator prevents backreflections into the laser 116 to help stabilize its operation.

Figure 2:
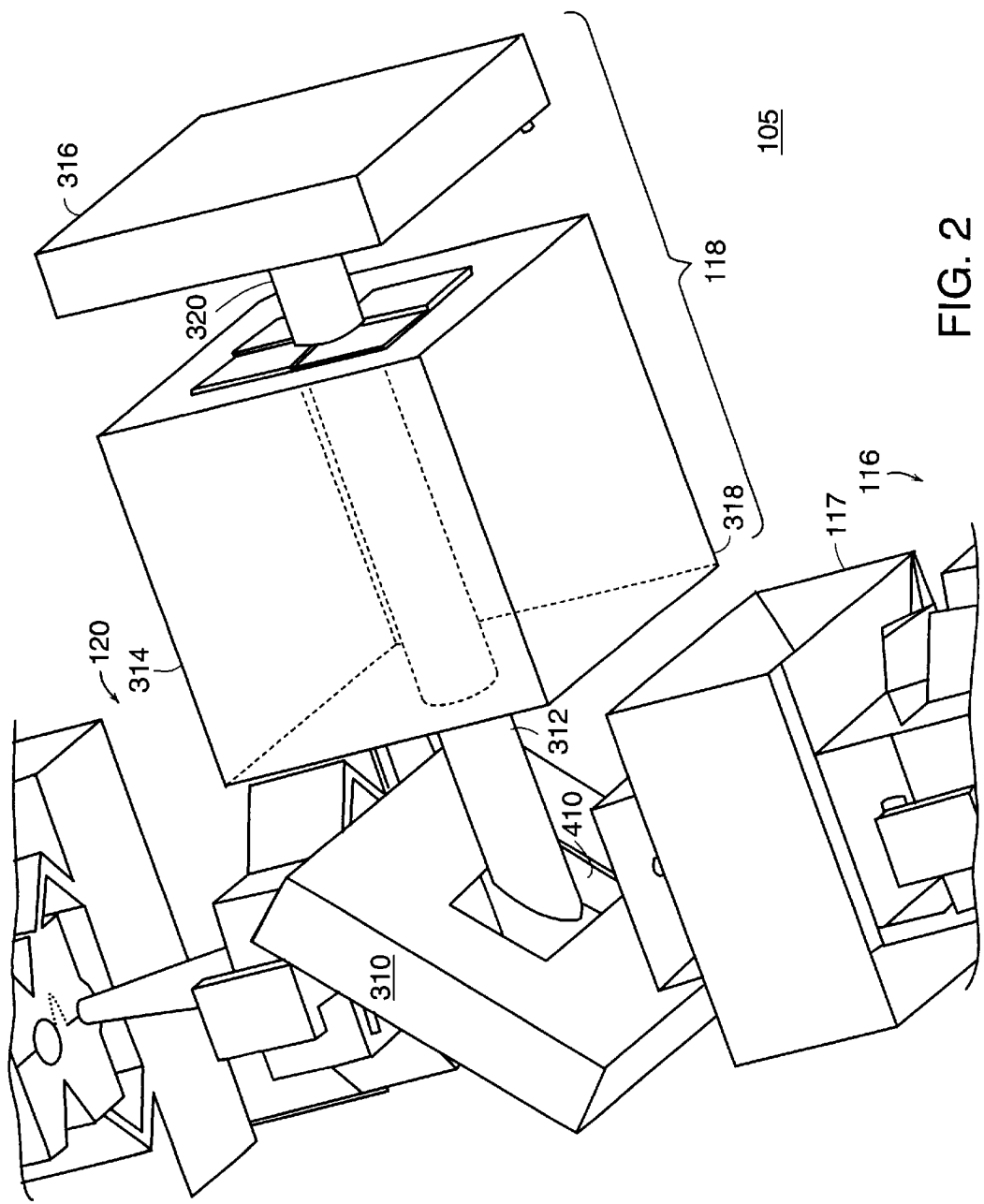
FIG. 2 is a perspective, close-up view showing the wavelength locker system of the present invention.

FIG. 2 shows the details of the wavelength locker system 118 of the tunable laser system 100. Specifically, beam splitter 310 splits the output beam 410 from the tunable laser system 116 such that a portion 312 of the beam is provided to the locker system 118 as its input beam.

The input beam 312 is filtered by what is termed a differential wavelength filter system. This system applies multiple spectral filtering characteristics to input beam 312.

In the preferred embodiment, the differential wavelength filter system 314 is a stepped etalon system that has bulk material 318 providing the general free spectral range of the etalon. Further, one end of the etalon has stepped sections that have different heights with respect to each other. These steps have the effect of fine-tuning the net free spectral range of the filter and yield the multiple spectral characteristics of the system.

The filtered beam 320 from the differential wavelength filter system is then received by a multi-element detector 316. This detector is aligned with the differential wavelength filter to detect the magnitude of the beam, and specifically, different portions of the beam to which the different spectral filtering characteristics have been applied.

Figure 3:
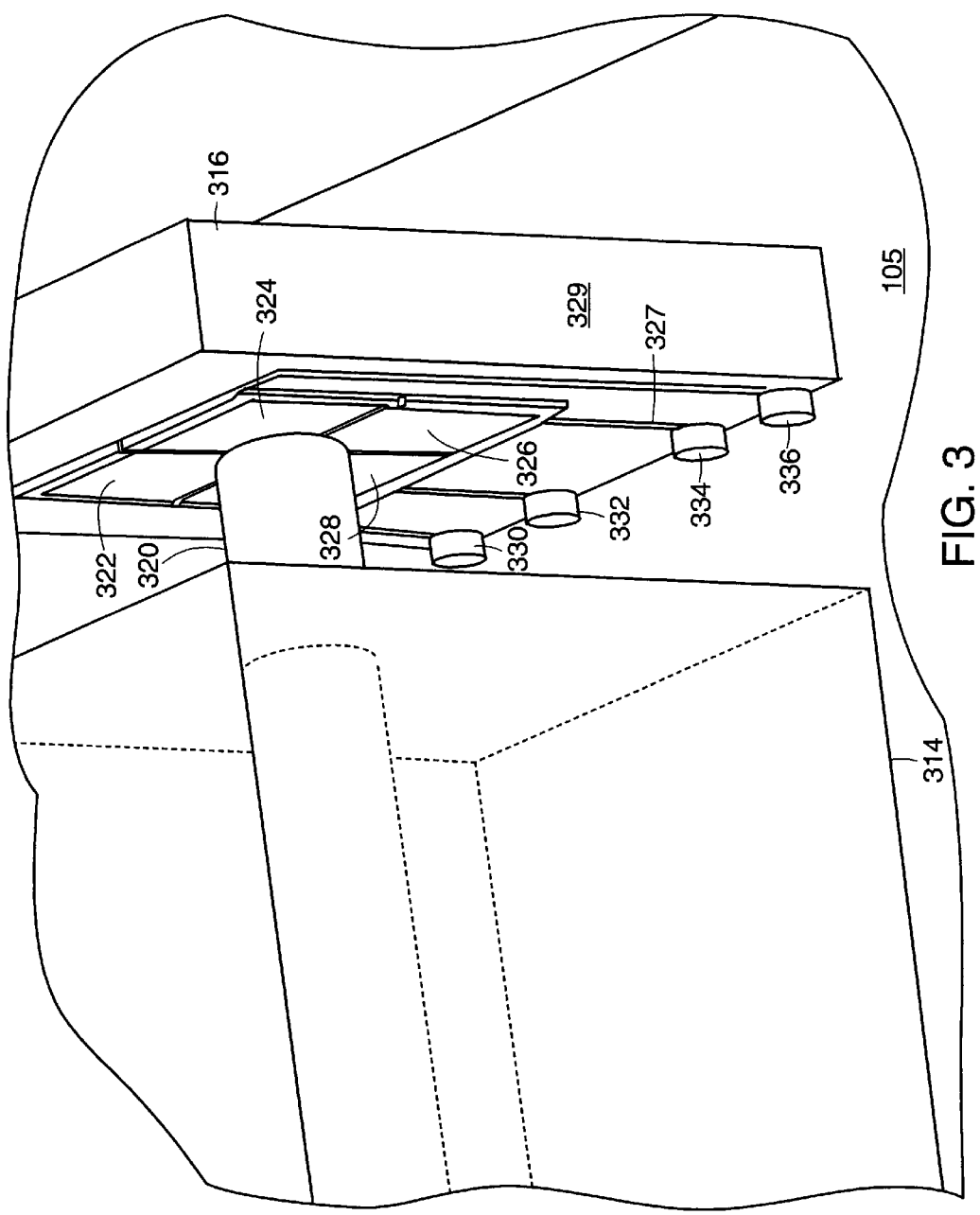
FIG. 3 is a perspective view showing the details of the multi-element detector of the wavelength locker system of the present invention.

FIG. 3 shows the multi-element detector 316. Specifically, in the present implementation, the multi-element detector 316 is a quad-detector with the individual detector elements 322, 324, 326, and 328 being commonly mounted on a single substrate-carrier that is is mounted in an orthogonal relationship to the plane of bench 105. Specifically, detector 316 comprises four discrete, photosensitive elements 322, 324, 328, and 326 that are laid out in square, grid fashion on the carrier 329. Each element 322–328 of the quad detector has a corresponding bond pad electrode 330, 332, 334, 336 with connecting wire traces formed on the substrate (see reference 327, for example). In this way, the magnitude of the optical energy impinging upon each element of the quad detector is separately, electrically detected via wire-bonding to the four bond pads 330–336.

Figure 4:
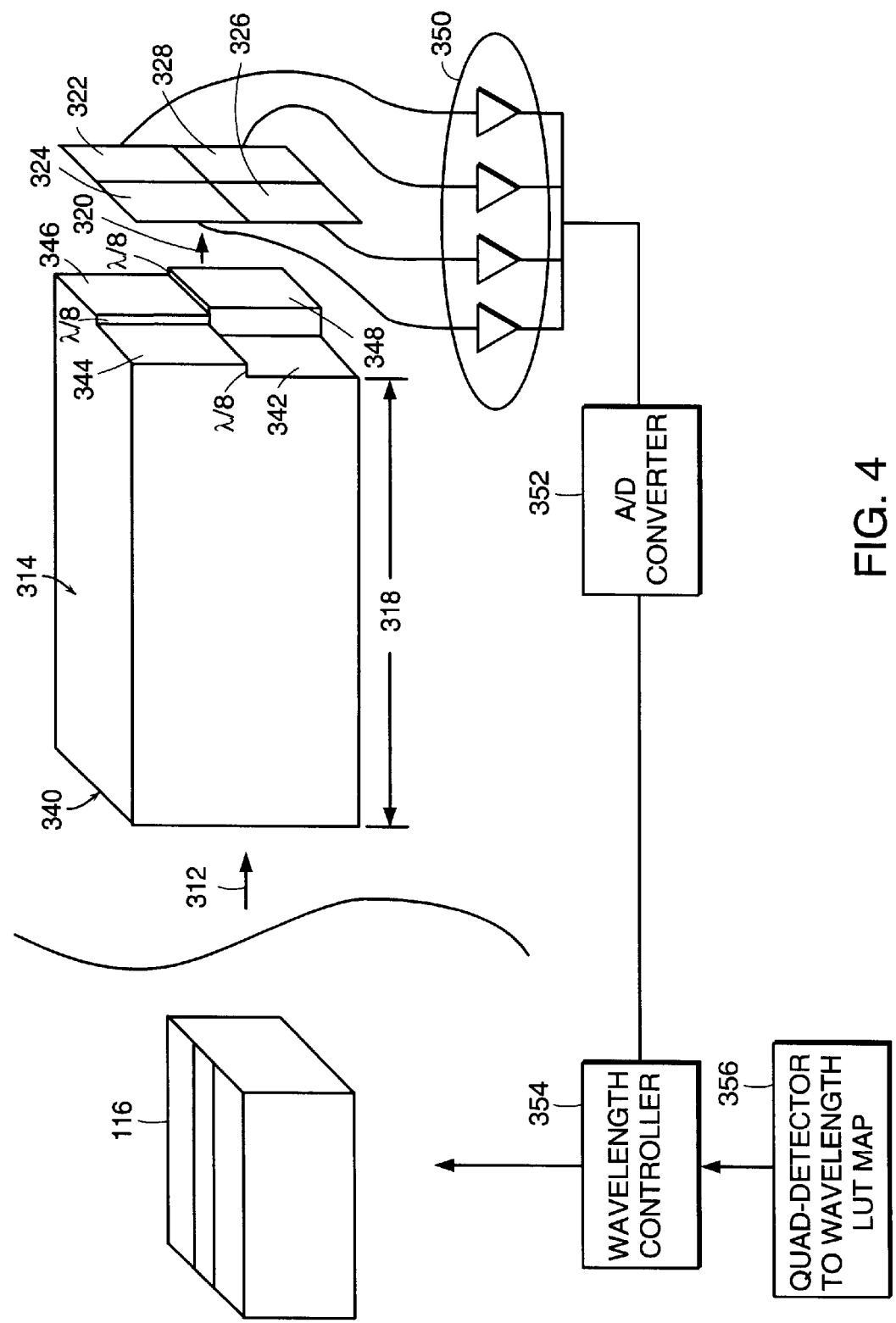
FIG. 4 is a block diagram/schematic view showing the stepped etalon, multi-element detector, and the electronics for controlling the semiconductor laser system of the present invention.

FIG. 4 illustrates the operation of the stepped etalon 314 and wavelength locker system opto-electronics. Specifically, the beam 312 from the tunable laser system 116 enters the stepped etalon 314. One face 340 of the etalon 314 has a standard, partially reflecting surface. The beam propagates through the bulk portion 318 of the etalon to the other partially reflecting surface of the etalon, which is stepped. Specifically, there are, in the illustrated embodiment, four separate faces 342, 344, 346, 348 at the other end of the etalon, each at a different optical distance from the first face 340.

Each one of surfaces 342, 344, 346, 348 corresponds to a different effective length etalon. Specifically, the etalon length difference between surface 342 and 344, in one embodiment is approximately ⅛ of the wavelength of the center operational wavelength of the system (⅛λ). The distance between the second surface 344 and third surface 346 is ⅛λ, and the distance between the third surface 346 and the fourth surface is ⅛λ. As a result, the stepped etalon provides multiple spectral filtering characteristics.

The magnitude of the light transmitted through the separate filter characteristics is then detected by the elements 322–328 of the quad detector. Specifically, the signals from the quad detector elements are amplified by an amplifier bank 350 and provided to either separate analog-to-digital (A/D) converters or one shared A/D converter circuit 352. The magnitude of the signals from the elements is then received by a wavelength controller 354.

The wavelength controller 354 compares the absolute and relative magnitudes of the is signals from the detectors 322–328. The wavelength controller 354 determines the wavelength of operation by reference to a quad-detector to wavelength mapper 356.

In one embodiment, this mapper 356 is an equation or translation function that relates the detector element response to a wavelength of operation of the tunable wavelength circuit 116. This equation or translation function was determined for the system at the time of manufacturing or later during a calibration or recalibration process. In another embodiment, the mapper 356 is implemented as a look-up table (LUT), which similarly records the quad detector element response to wavelength relationship. Based on this information, the wavelength controller then tunes the wavelength of operation of the tunable laser 116. In a simple embodiment, this can be accomplished by adjusting injection current or current to the thermoelectric cooler to thereby control the tunable laser's wavelength of operation. As described later, in the present embodiment, it is also used to tune a cavity element of the tunable laser 116.

In other embodiments, the sum signal from the elements of the quad-detector is used to determine amplitude, allowing the controller to further provide amplitude feedback control.

This information is also used to tune the cavity length.

Figure 5:
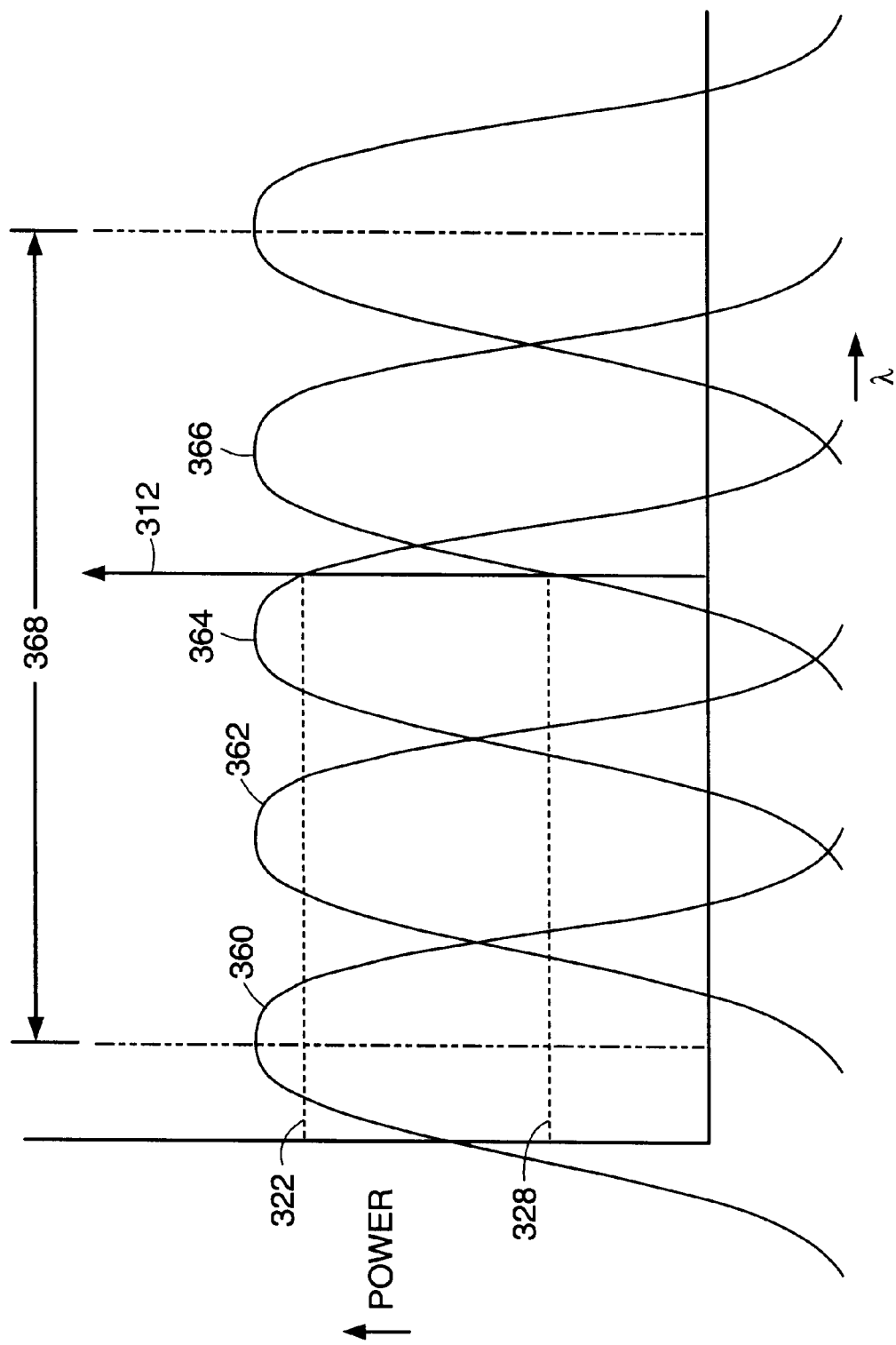
FIG. 5 is a spectral plot of power as a function of wavelength (arbitrary units) showing the multiple spectral filtering characteristics of the differential wavelength filter system and the relationship to a wavelength of operation of the laser system.

FIG. 5 is a spectral plot illustrating the operation of the wavelength locker 118. Specifically, the differential wavelength filter 314, in its stepped etalon configuration, applies essentially four separate filtering characteristics or transfer functions 360, 362, 364, 366 corresponding to the endfaces 342, 344, 346, and 348 of the stepped etalon 314. These multiple spectral filtering characteristics repeat themselves spectrally in increments of the free spectral range 368 determined by the bulk 318 of the etalon 314. As a result, each of the detector elements detects a different filtered version of the input beam.

Specifically, in the illustrated case, if the wavelength of the input signal 312 is as illustrated, detector 322 receives a relatively strong signal since the emission from the tunable laser 312 is near the peak of its corresponding filtering characteristic 364. Detector element 328 receives a smaller signal since the emission wavelength is a greater spectral distance from the peak of its corresponding filtering characteristic 366. The other detectors receive relatively small signals.

The wavelength controller 354 then compares the relative intensities of the signals from the various detector elements and then uses the wavelength mapper 356 to determine the wavelength of operation of the semiconductor laser system 116. Generally, for the wavelength controller to resolve the wavelength of the signal, it must receive a sufficient signal from at least two detectors since a given voltage from a single detector can be mapped to two distinct wavelengths as illustrated by the fact that line 322 intersects characteristic 364 at two different wavelengths.

Figure 6:
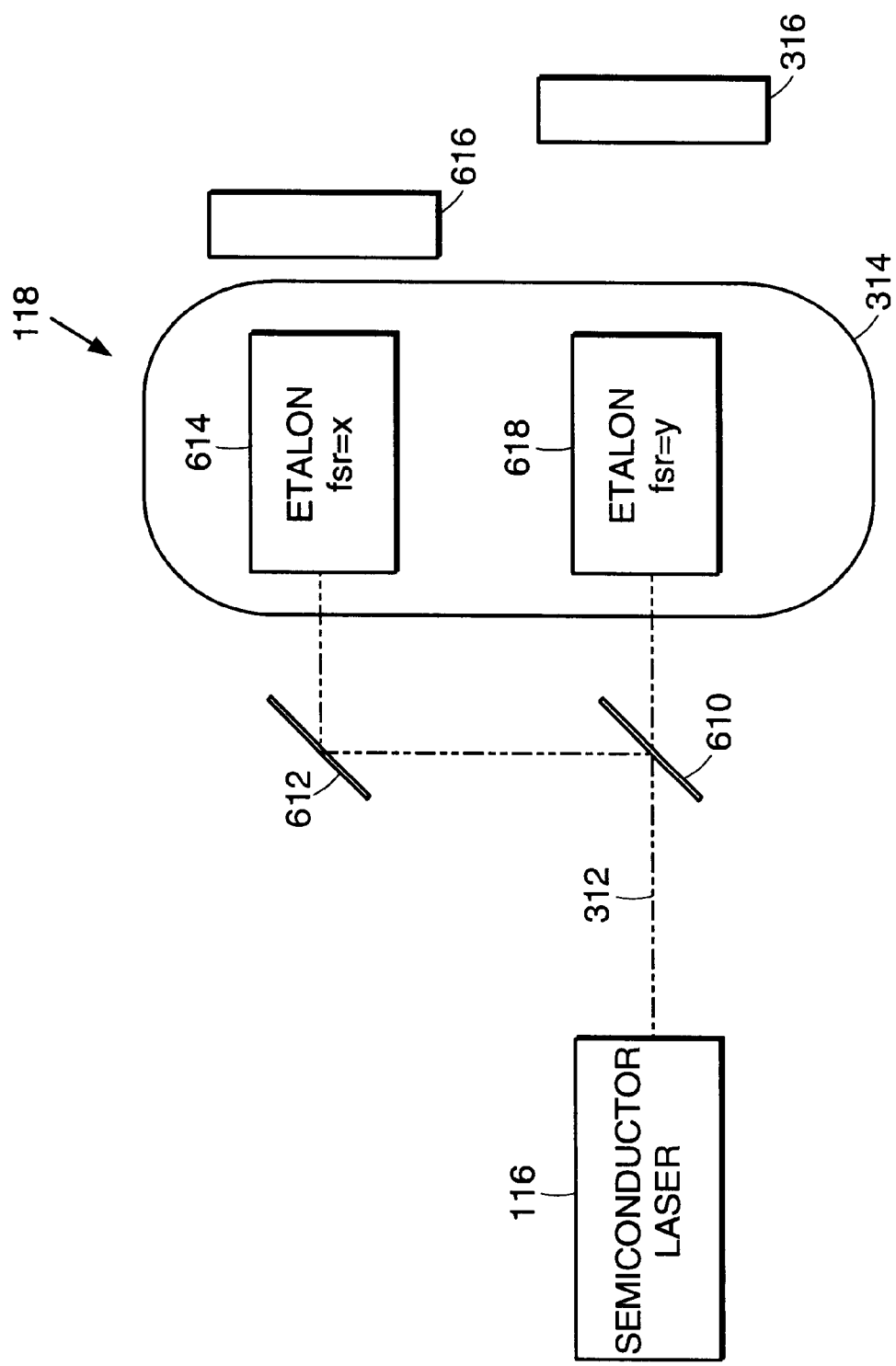
FIG. 6 is a block/schematic view of another embodiment of the wavelength locker system utilizing a coarse and fine etalon system of the present invention.

FIG. 6 illustrates another embodiment of the wavelength locker system 118. In this configuration, the input signal 312 from the tunable semiconductor laser 116 is again divided by a second beam splitter 610 of the locker and then redirected by an optional fold mirror 612 so that two discrete beams enter the differential wavelength filter system 314. This second embodiment differential filter system, however, comprises two stepped etalons 618, 614, and two separate multi-element quad detectors 616 and 316.

In this embodiment, etalon 614 corresponds to a coarse filtering etalon. Specifically, it is again an etalon with a multiple steps at its output facet. The bulk material, however, has a free spectral range corresponding to a relatively wide or coarse spectral band. In the present embodiment, it has a free spectral range of approximately 50 to 150 nm. Specifically, it is anticipated that its free spectral range exceeds 100 nm. This allows it to have a free spectral range that covers the entire wavelength band associated with common WDM systems. Such system bands stretch from about 1500 to 1600 nm. In this way, the corresponding coarse multi-element detector 616 can be used to determine a general or coarse wavelength of operation of the tunable laser 116.

The fine detecting etalon 618 has a much smaller spectral range. Typically, its spectral range is less than 10 nm and most commonly less than one nm. This fine filtering etalon in combination with the fine multi-element detector 316 allows for fine wavelength detection of the beam 312 from the tunable laser 116. Specifically, because of its much narrower free spectral range, it can more precisely determine the wavelength of operation.

As a result, the coarse and fine multi-element detectors are used in combination to first determine the general wavelength of operation with the coarse multi-element detector, and thereby determine which mode of the fine-element detector etalon is being excited. Then, the fine multi-element detector is then used to control precisely the wavelength to better than 0.1 nm accuracy.

Figure 7:
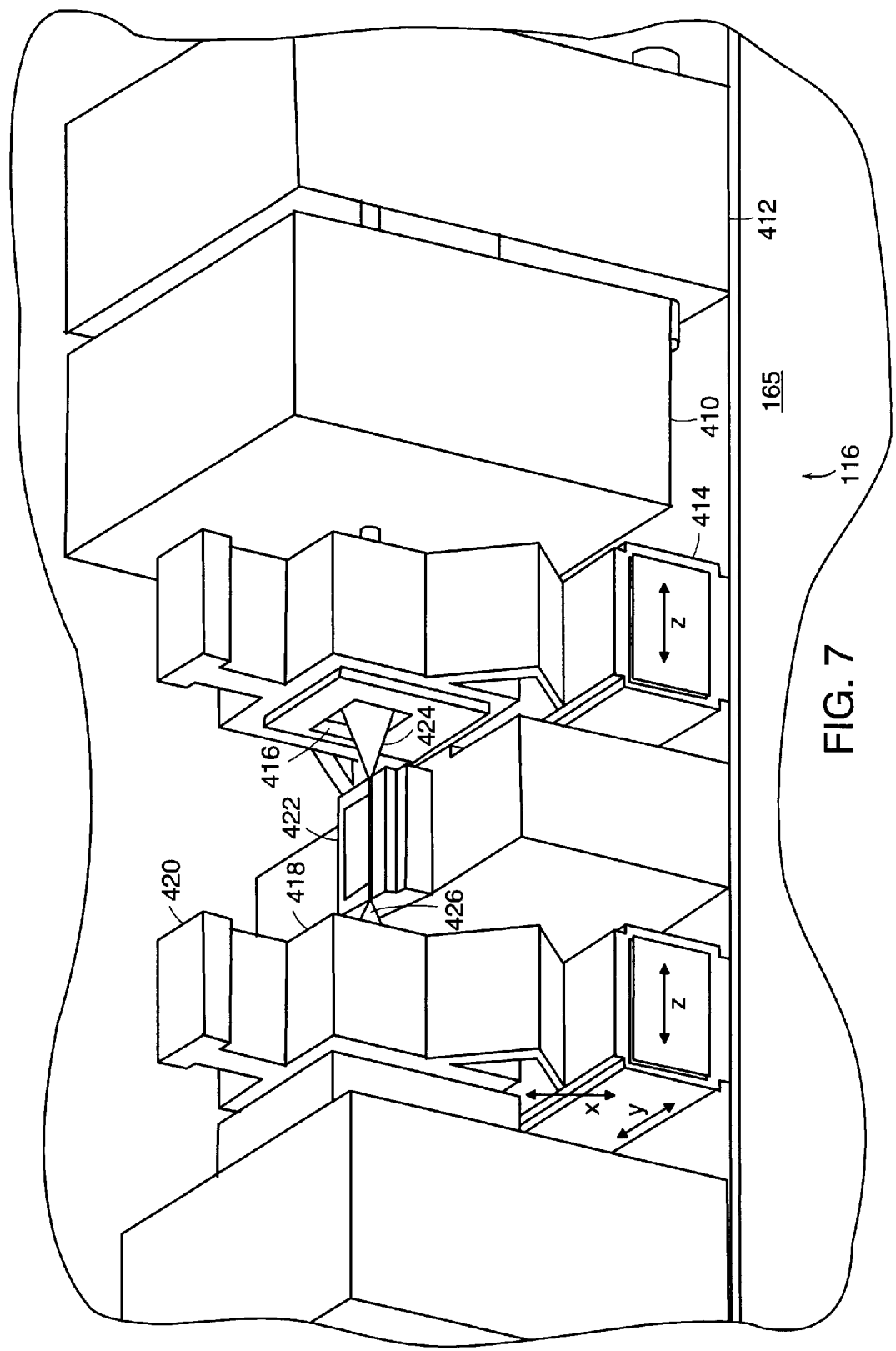
FIG. 7 is a close-up view showing the semiconductor optical amplifier portion of the tunable laser of the present invention and the laser cavity of the present invention.

In other embodiments, one stepped coarse etalon and one standard, non-stepped, fine etalon are used in a cascade arrangement. One quad detector detects the output of the first etalon, and the other detects the signal after propagating through both etalons FIG. 7 shows the specifics of the preferred embodiment of the tunable laser system 116. Generally, the tunable laser 116 comprises a semiconductor gain medium 422. In the preferred embodiment, the gain medium is, for example, a semiconductor optical amplifier (SOA) chip constructed from InGaAsP/InP, for example. As is common, the chip 422 has an anti-reflection coated rear facet. The front facet is coated to define the front reflector of the laser cavity. In one embodiment, the front facet coating provides between 5 and 15% power reflectivity. The tunable laser further comprises a tunable Fabry-Perot filter or cavity 410 and a laser cavity length modulator 412 with polarization rotators material, such as quarter-wave plates or Faraday rotators, to prevent amplification of rejected light from the filter in the chip 422.

According to the preferred implementation, the SOA chip 422 is polarization anisotropic. As such, it only amplifies light that is either TM or TE polarized. As is commonly known, this is accomplished by controlling the strain in the quantum well layers of the chip during wafer-stage epitaxial growth to either have tensile strain (TM) or compressive strain (TE).

Utilizing a polarization anisotropic SOA chip runs contrary to the typical design of SOA's. When used as amplifiers, it is typically desirable to amplify light regardless of its polarization. In the current invention, the polarization anisotropy, however, is used to avoid the amplification of light rejected from the tunable filter 410 as described below.

Light is coupled out and into the SOA chip 422 by front and rear facet focusing lenses 418, 416, which are supported on respective mounting structures 420 and 414. These mounting structures allow for the x-, y- and z-axis alignment of the lenses 418 and 416 relative to the facets of the chip 422 after construction of the system to improve the coupling efficiency both into and out of the SOA chip 422.

Figure 8:
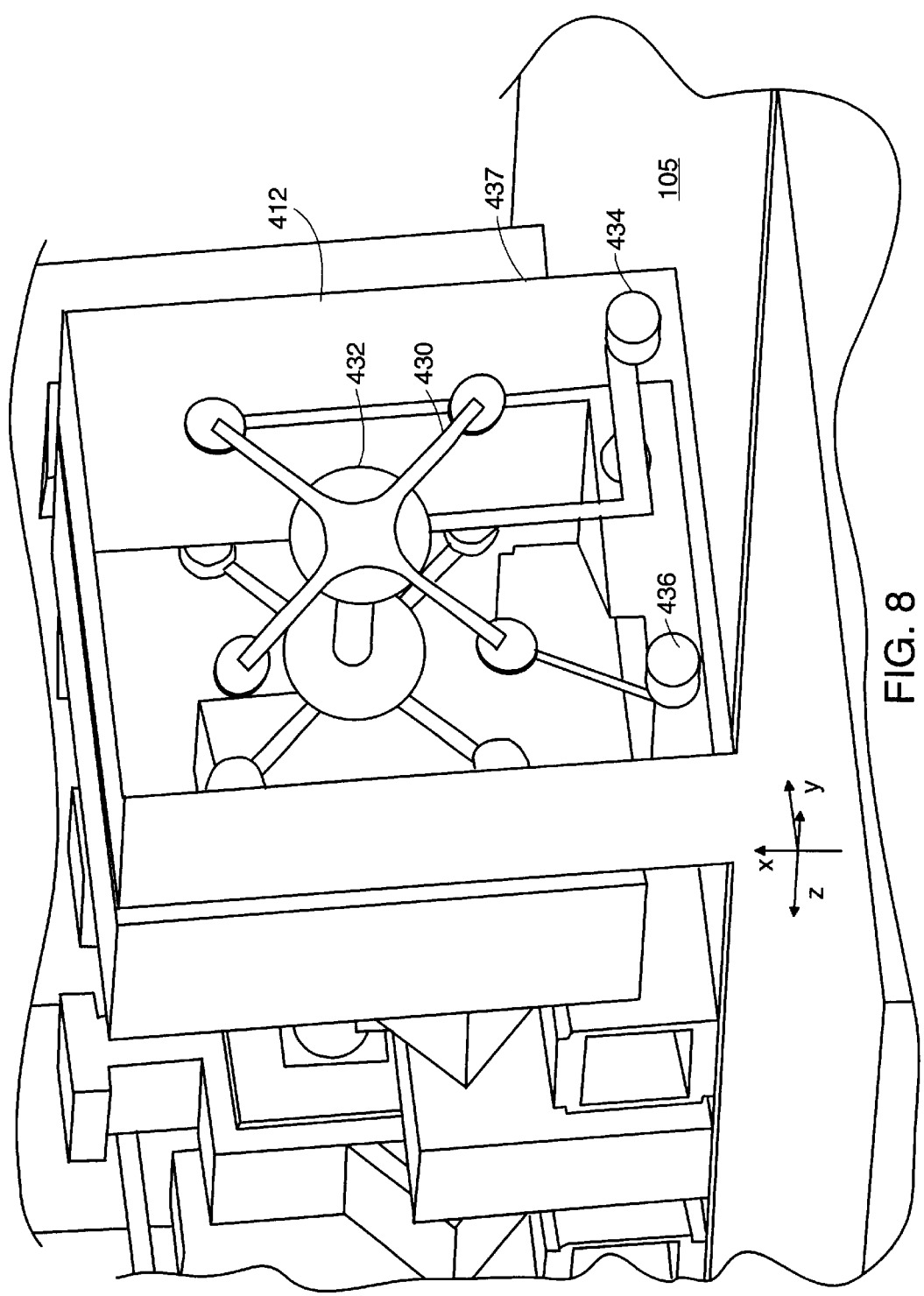
FIG. 8 is a perspective view showing the tunable Fabry-Perot cavity and the cavity length modulator of the present invention.

FIG. 8 illustrates the details of the cavity length modulator. The modulator is constructed on a rotator-material substrate 436, which is attached to bench 105. On the back surface of the substrate, a highly reflecting membrane 430 is fabricated. In the preferred embodiment, this membrane is a flexing membrane constructed from a metal such as aluminum or semiconductor material such as silicon.

This membrane is translated axially, or in the direction of the z-axis by applying an electrical potential between the membrane 430, via an electrical connection to pad 436, and a stationary membrane electrode 432, via pad 434. As a result, by controlling the electrostatic voltage level between the membrane 430 and the stationary membrane electrode 432, the membrane is translated in a controlled fashion. Since the membrane is highly reflecting or HR coated and defines the cavity length, the length of the laser cavity is thus modulated.

Figure 9:
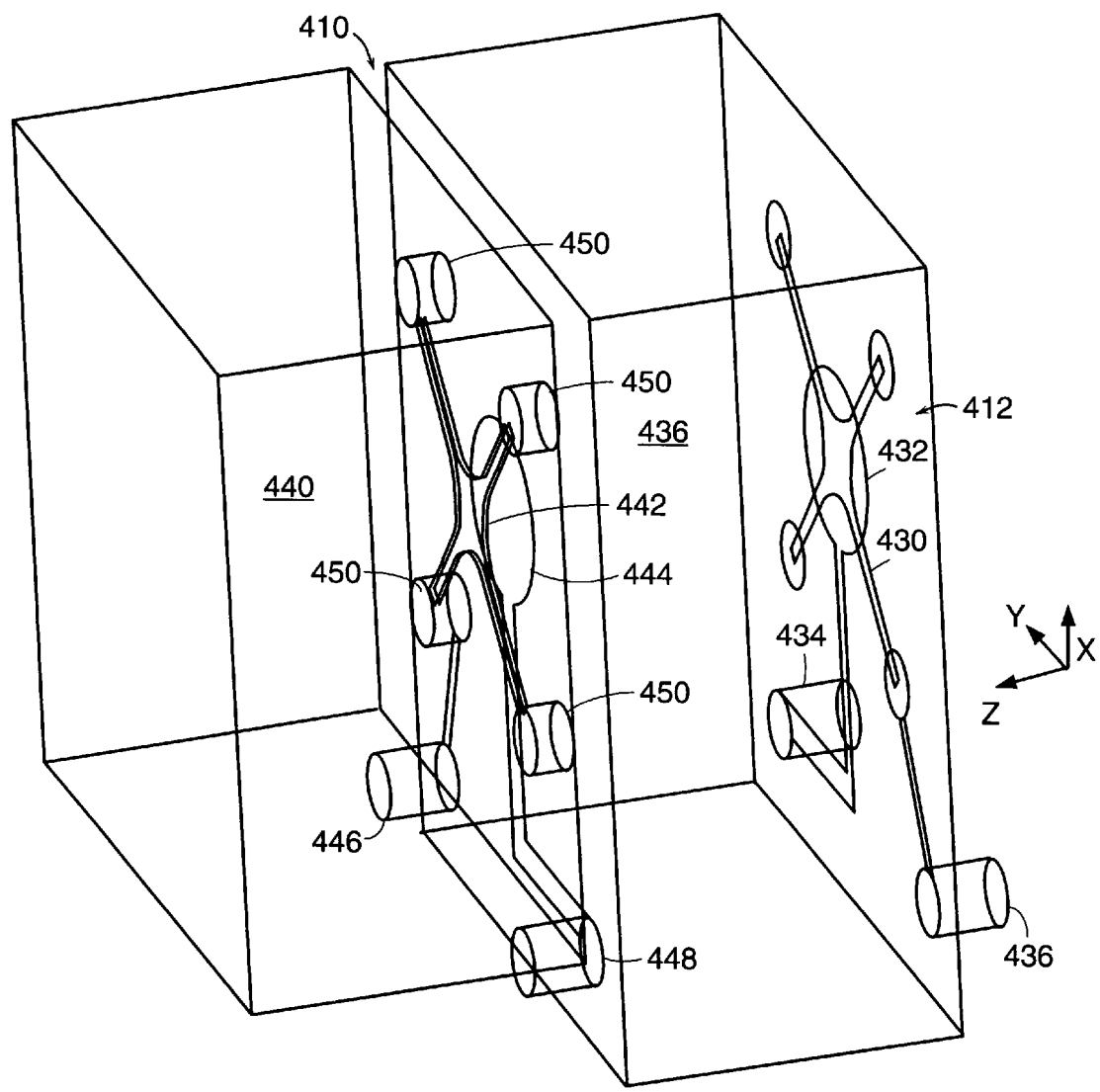
FIG. 9 is a perspective view showing the integration of the tunable Fabry-Perot cavity and cavity length modulator according to the present invention.

FIG. 9 illustrates the tunable Fabry-Perot filter 410 and its relationship to the cavity length modulator 412. Specifically, the tunable Fabry-Perot (FP) filter or cavity 410 is constructed between two rotator material substrates 440, 436. The FP cavity comprises a front partially reflecting surface, which is constructed from a movable partially reflecting membrane 442. This membrane is supported on support posts 450 in proximity to a stationary electrode 444, which is fabricated or deposited on the proximal side of the second rotator material substrate 436. The stationary electrode also functions as the second partially reflecting surface of the FP cavity. The membrane is preferably constructed from silicon, for example. The posts also function as stand-offs with respect to the two rotator substrates 440, 436 to thereby define the length of the FP cavity demarcated by the membrane 442 and the electrode 444.

By applying a voltage between bond pad 448 and bond pad 446, an electrostatic field is generated between partial reflecting membrane 442 and the electrode 444. This field flexes the membrane to provide z-axis movement of the reflector electrode 442 to change the distance between the membrane 442 and the partial reflector-electrode 444 to thereby change the filtering characteristic or passband and thus tune the Fabry-Perot filter 410. This controls the spectral location of the laser cavity's gain.

In the illustrated embodiment, the bond pads 448, 446 also function as x-axis alignment stubs for facilitating construction of the Fabry-Perot cavity 410/cavity length modulator 412, typically prior to installation on the bench 105. Specifically, they facilitate the attachment of the rotator material substrates to each other by allowing the height alignment between substrates 436, 440.

The rotator material substrates 440 and 436 co-act to prevent rejected light from the FP cavity from being amplified in the SOA chip 422, whereas passband light is amplified.

Specifically, in the preferred embodiment, the material and thickness of the substrates 440, 435 is selected such that they function as Faraday rotators that rotate the polarization of transmitted light by 45°. Specifically, light emitted from the rear facet of the SOA chip 422 is polarized either orthogonally or parallel, depending on the strain characteristics of the chip's quantum well(s). The light is subsequently rotated 45° before entering the FP cavity 410 by the rotator material substrate 440.

The FP cavity divides the light into the resonant and off-resonant components. That is, light outside the passband of the FP cavity is reflected to return to the SOA chip via a second pass through the first rotator substrate 440. This rotates the light a further 45°. Since the light rejected by the FP cavity is now orthogonal to the light emitted by the chip 422 it passes through the chip without amplification because of the designed polarization anisotropy. The low reflectivity of the chip front facet prevents reflection of most of the light back into the laser cavity and consequently the lasing in the double round-trip configuration.

In contrast, light at the FP cavity's passband, i.e., the resonant light, passes through the FP cavity and enters the second rotator material substrate 436 and is reflected by the membrane 430 to return. As a result, it is rotated 45° twice in the first substrate 436 and 45° again in the second substrate 440 after passing back through the FP cavity. Thus, this returning passband light, in contrast to the rejected light, is polarized parallel to the light generated in the SOA chip and this is amplified, resulting in the tunable laser functionality.

In one embodiment the rotator material substrates are constructed from latched garnet crystal material as sold by Mitsubishi Gas Chemical Co., Inc.

In another embodiment, quarter-wave plates are used as the substrates 440 and 436. Quarterwave plates can be used since the polarization of the light from the SOA chip is known and invariant. Specifically, in this embodiment, light passes through the first quarterwave plate polarization rotator 440 and is converted to circularly polarized light. Rejected light from the filter passes back through the first polarization rotator to be converted to light that is orthogonal in polarization to the light from the SOA chip, and thus it is not amplified. In contrast, passband light passes through tunable filter to the second quarterwave plate polarization rotator 436 and converted to orthogonally polarized light and reflected. As it returns, it is converted to a parallel polarization after successively passing through the second and first quarterwave plates.

In still another embodiment, subwavelength period grating substrates are used as polarization rotators. Such gratings, as described in *Applied Physics Letters* 42 (6), Mar. 15, 1983, page 492, do not diffract the light, but instead operate as a homogenous birefringent material to rotate the polarization of the beam. In one implementation, the gratings are etched, or otherwise formed, onto a side of the bulk substrates 440, 436 to a depth required for quarterwave operation. In still other embodiments the polarization rotation is performed by liquid crystal, preferably in photopolymerizable polymer utilizing photoalignment.

Figure 10:
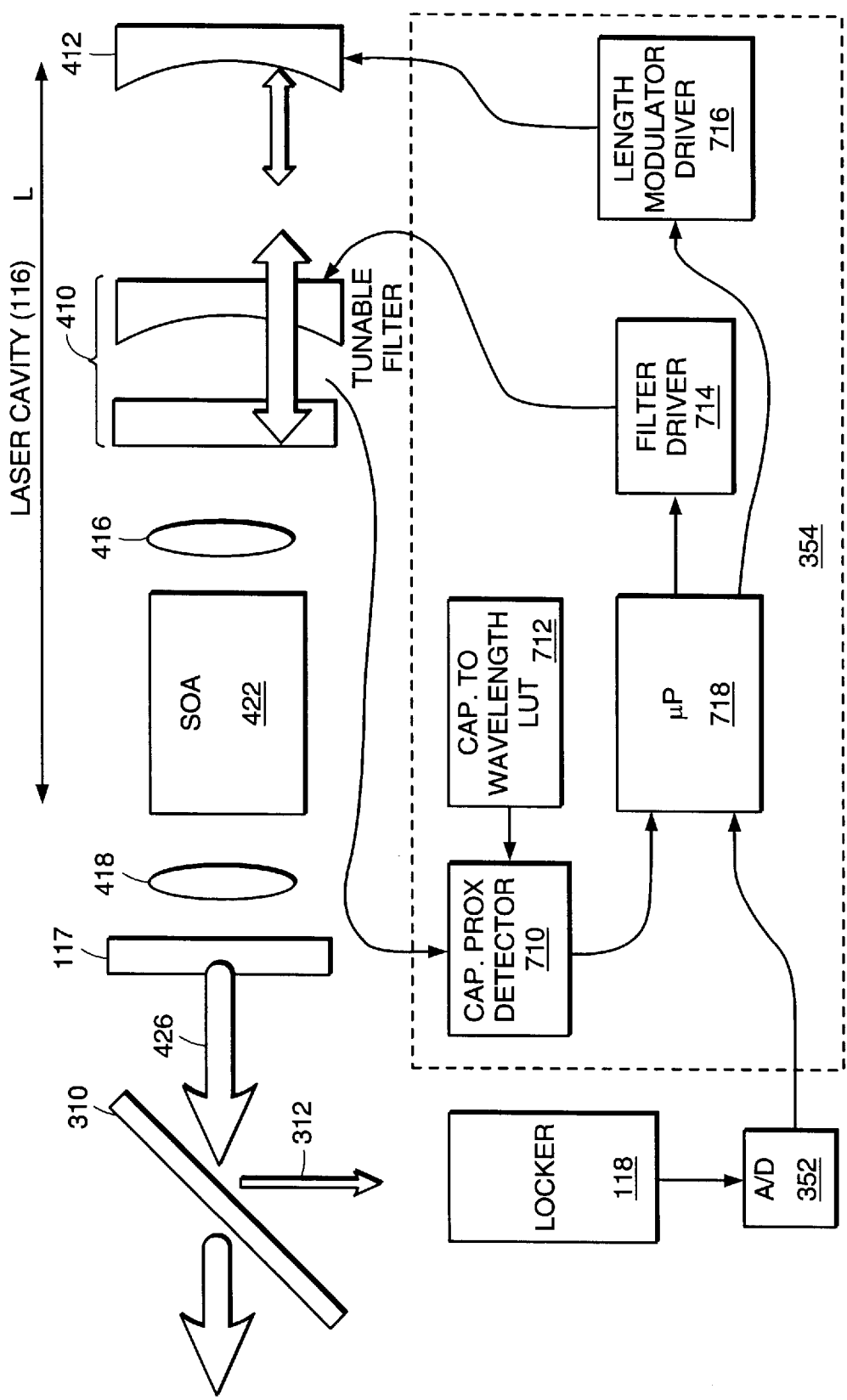
FIG. 10 is a schematic block diagram illustrating the electronic control scheme according to the present invention for the tunable laser.

FIG. 10 illustrates the electronic control scheme for the tunable laser 100. Specifically, a locker system 118 is used to generate a signal indicative of the wavelength of operation of the tunable laser section 116. In one implementation, this locker is configured as described previously herein. In any case, however, the information from the wavelength locker system 118 is then fed to the wavelength control system 354.

More specifically, in one embodiment, the wavelength controller 354 comprises a microprocessor 718. The microprocessor 718 controls the tunable filter 410 and the cavity length modulator 412 via a filter driver 714 and length modulator driver 716. In one implementation, each of these drivers 714, 716 comprises a digital-to-analog converter that converts a digital voltage setting from the microprocessor 718 into an electrostatic drive voltage for the tunable filter 410 and the cavity length modulator 412.

In one embodiment, the wavelength controller further comprises a capacitance proximity detector 710 and capacitance-to-wavelength look-up table or mapper 712. Specifically, the proximity detector detects a capacitance between the membrane 442 of the Fabry-Perot filter and the stationary electrode 444. This detected capacitance is then converted to a current wavelength of operation of the tunable filter by using the detected capacitance as an address into the look-up table or mapper 712. The mapper contains the relationship between the Fabry-Perot filter's passband and the membrane-electrode capacitance. By detecting the capacitance, the current passband of the tunable filter is found without an optical reference signal. This information is passed to the controller.

Of course, the mapper can alternatively be implemented as an equation or function instead of a look-up table. This is a more compact implementation especially where the relationship is linear or near linear.

Figure 11:
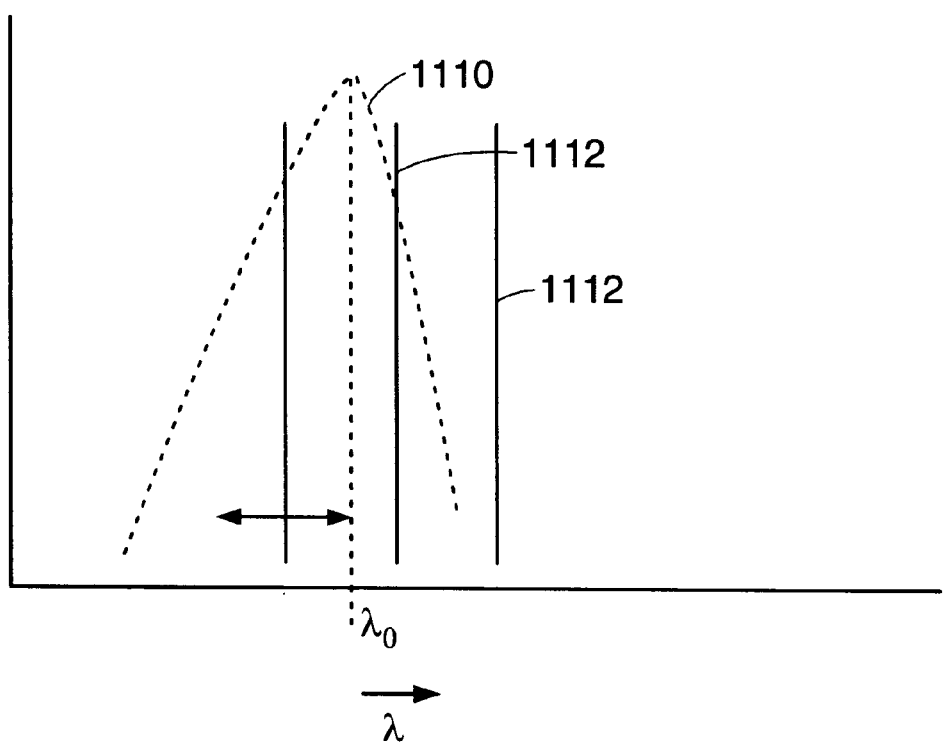
FIG. 11 is a spectral plot of power as a function of wavelength (arbitrary units) showing the relationship between the wavelength of operation or passband of the Fabry-Perot filter and the cavity modes of the laser cavity of the tunable laser prior to compensation by the cavity length modulator.

FIG. 11 illustrates the operation of the semiconductor tunable laser system and the control of the tunable Fabry-Perot cavity 410 and the cavity length modulator 412 by the microprocessor 718. Specifically, the desired wavelength of operation $\lambda_0$ is achieved by tuning the Fabry-Perot cavity such that the filtering characteristic 1110 of the Fabry-Perot cavity has a peak at the desired wavelength $\lambda_0$. This is achieved in one embodiment by reference the capacitance to wavelength look-up table or mapper 712. Optical reference signals are used in other implementations.

As is known, the laser cavity has discrete longitudinal modes of operation 1112. The modal separation is related to the cavity length of the laser:

$$\Delta\lambda = \lambda_0^2/(2\ nL)$$

where L is the length of the cavity and n is the refractive index.

According to the present invention, the Fabry-Perot cavity 410 is first tuned to the desired wavelength of operation, then the cavity length modulator 412 is driven to vary the physical length of the laser cavity by an amount that is typically less than one wavelength of light at the operational wavelength. The operational wavelength is typically less than 1610 nm. Minimally, to render a mode coincident with the desired wavelength of operation, the length should only need to be adjusted by one half of a wavelength either larger or smaller.

Typically, this one-half wavelength distance is less than 1000 nm.

In FIG. 11, no mode is aligned with the peak of the Fabry-Perot cavity filtering characteristic 110. This can result in either mode-hopping between modes for which the laser system has gain, or suboptimal power output because of the difference between the peak of the transfer function of the passband of the Fabry-Perot cavity and the next closest cavity mode.

This fine intercavity mode tuning is achieved in one embodiment by reference to the absolute wavelength as detected by the locker 118. In another embodiment, the cavity length is adjusted until the output power is maximized, which will occur when a cavity mode is centered at the center wavelength of the FP filter 410 and/or there is no mode-hopping between two or more competing modes within the passband. In either case, one of the cavity modes 112 is placed to reside at the peak of the passband of the Fabry-Perot cavity 410. In this way, the present invention makes the necessary correspondence between the pass wavelength of the tunable Fabry-Perot cavity and a longitudinal mode placement of the laser cavity.

The present invention is most applicable to tunable lasers having short laser cavities. According to the present invention, the length of the laser cavity (See distance "L" in FIGS. 1 and 10) is preferably less than three centimeters. In the preferred embodiment, it is less than one centimeter. This length yields a modal separation of greater than a 3 Giga-Hertz (GHz). Preferably, the spacing is greater than 10 GHz, with a spacing of better then 20 to 30 GHz being ideal.

Figure 12:
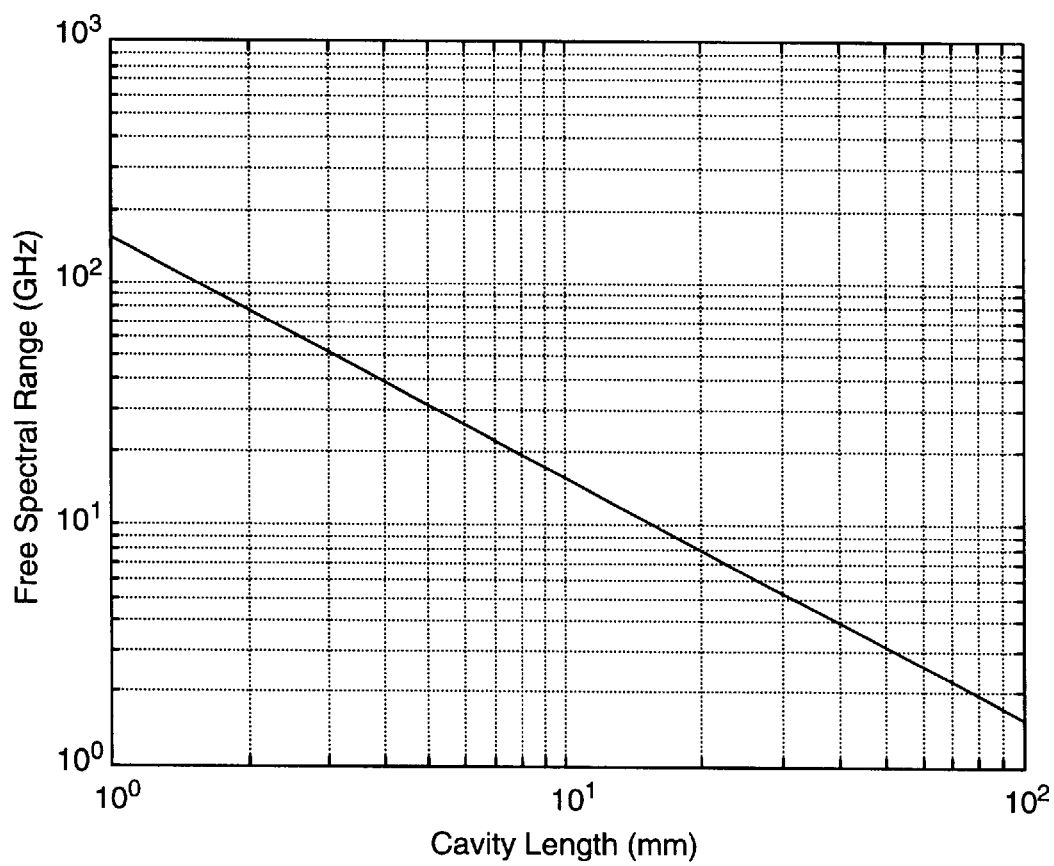
FIG. 12 is a plot of free spectral range in GHz as a function of cavity optical length in millimetres.

FIG. 12 illustrates the relevance of the short laser cavity L to modal spacing. Laser cavities of three centimeters and longer have free spectral ranges of approximately 3 GHz and less. With such close modal spacing, the need for cavity length adjustment can be avoided. Specifically, modern dense WDM (DWDM) systems contemplate channel spacings of 100 GHz with reference to the L$\alpha$, C$\alpha$, and S$\alpha$ bands in the ITU 100 GHz grid. Denser systems contemplate 50 GHz channel separations as specified in the Lβ, Cβ, and Sβ band of the 50 GHz offset ITU grid. At these channel separations, transmitter frequency must be specified to typically about +/−5 GHz. The modal spacing in a four centimeter or longer cavity can inherently accommodate these close channel spacing, but short cavities of one centimeter or less as preferred in the present invention yield mode spacings of greater than 10 GHz. Thus, the short cavity lasers, such as the instant invention, necessitate cavity length compensation as achieved with the cavity length modulator 412 of the present invention.

The preceding analysis suggests that longer cavity lasers are in fact desirable, since they avoid the need for cavity length adjustment in DWDM systems. Two factors, however, advocate for shorter cavity configurations: 1) device size; 2) an FP filter finesse requirements.

DWDM systems comprising up to one hundred channels or more require a corresponding number of tunable transmitters. In such complex systems, individual device sizes become critical and there is a need to have small transmitter form factors. In short, smaller is typically better from the standpoint of integration.

Higher finesse Fabry-Perot filters are required as cavity mode spacing decreases. The bandwidth of the Fabry-Perot filter must be narrow enough to select and restrict the tunable laser to single mode operation. When modes are tightly spaced, high finesse Fabry-Perot filters are required to avoid mode hopping or multi-longitudinal mode operation.

In contrast, when a shorter cavity is used, a much lower finesse or "quality" Fabry-Perot filter can be used that has a wider bandwidth end to 100 GHz. The ability to use a lower finesse Fabry-Perot filter decreases alignment tolerances between the SOA 422 and the filter, increases the gain of the laser cavity, and the avoids the requirement to fabricate very thick, multi-layer dielectric coatings on the surfaces of the Fabry-Perot filters. These factors substantially reduce cost and manufacturing complexity of the device.

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor tunable laser system, comprising:
   a semiconductor chip functioning as a laser gain medium within a laser cavity;
   a tunable filter within the laser cavity for selecting a wavelength of operation of the laser system;
   a cavity length modulator that modulates an optical length of the laser cavity; and
   a controller that tunes the tunable filter to a desired wavelength of operation and controls the cavity length modulator so that a longitudinal mode of the laser cavity resides at the desired wavelength of operation.

2. A semiconductor tunable laser system as claimed in claim 1, wherein the semiconductor chip comprises a semiconductor optical amplifier chip with a reflective front facet and antireflection coated rear facet.

3. A semiconductor tunable laser system as claimed in claim 1, wherein the tunable filter is a Fabry-Perot filter and comprises serial first and second partial reflectors and means for changing an optical distance between the reflectors.

4. A semiconductor tunable laser system as claimed in claim 1, wherein the tunable filter is a Fabry-Perot filter and comprises a stationary partial reflector, a movable partial reflector including a reflector electrode, and a stationary electrode, wherein the controller modulates an electric field between the reflector electrode and the stationary electrode to change a distance between the stationary partial reflector and the movable partial reflector and thereby select a wavelength of operation of the laser system.

5. A semiconductor tunable laser system as claimed in claim 1, wherein the cavity length modulator comprises a movable reflector defining one end of the laser cavity.

6. A semiconductor tunable laser system as claimed in claim 5, wherein the movable reflector is highly reflective to define a back-end of the cavity.

7. A semiconductor tunable laser system as claimed in claim 5, wherein the movable reflector comprises a movable membrane including a membrane electrode and a stationary electrode, wherein an electric field between the membrane electrode and the stationary electrode displaces the movable membrane to thereby change a length of the cavity.

8. A semiconductor tunable laser system as claimed in claim 1, further comprising:
   an hermetic package;
   an optical bench sealed within the package, the semiconductor chip, the tunable filter, and the cavity length modulator being attached to the optical bench.

9. A semiconductor tunable laser system as claimed in claim 8, further comprising a fiber pigtail entering the package via a fiber feed-through to connect to the bench and terminate above the bench to receive a laser beam from the laser cavity.

10. A semiconductor tunable laser system as claimed in claim 9, further comprising an output-focusing lens for coupling the laser beam into the fiber pigtail.

11. A semiconductor tunable laser system as claimed in claim 8, further comprising focusing lenses installed on the bench at either end of the semiconductor chip to couple optical energy into and out of the chip.

12. A semiconductor tunable laser system as claimed in claim 1, wherein the cavity length modulator changes a length of the laser cavity over of a distance corresponding to about the wavelength of operation.

13. A semiconductor tunable laser system as claimed in claim 1, wherein the cavity length modulator changes a length of the laser cavity over of a distance corresponding to about one half of the wavelength of operation.

14. A semiconductor tunable laser system as claimed in claim 1, further comprising a polarization rotator for rotating a polarization of light rejected by the tunable Fabry-Perot filter to prevent amplification of the rejected light.

15. A semiconductor tunable laser system as claimed in claim 1, further comprising an additional rotator for rotating a polarization of light passed by the tunable Fabry-Perot filter to enable amplification of the passband light.

16. A semiconductor tunable laser system as claimed in claim 1, wherein the tunable filter has a low finesse being able to limit the operation of the laser cavity to a single mode of cavity mode spacings of greater than 3 GigaHertz.

17. A semiconductor tunable laser system as claimed in claim 1, wherein the tunable filter has a low finesse being able to limit the operation of the laser cavity to a single mode of cavity mode spacings of greater than 10 GigaHertz.

18. A semiconductor tunable laser system as claimed in claim 1, wherein the tunable filter has a low finesse being able to limit the operation of the laser cavity to a signal mode of cavity mode spacings of greater than 20 GigaHertz.

19. A semiconductor tunable laser system as claimed in claim 1, wherein a cavity mode spacing of the laser cavity is greater than 3 GigaHertz.

20. A semiconductor tunable laser system as claimed in claim 1, wherein a cavity mode spacing of the laser cavity is greater than 10 GigaHertz.

21. A semiconductor tunable laser system, comprising:
   an optical bench;
   a semiconductor chip, installed on the optical bench, functioning as a laser gain medium within a laser cavity;
   a tunable Fabry-Perot filter, installed on the optical bench, within the laser cavity for selecting a wavelength of operation of the laser system; and
   a wavelength locker system, installed on the optical bench, including:
      a differential wavelength filter system that applies multiple spectral filtering characteristics to a beam from the laser cavity;
      a multi-element detector that is aligned to the differential wavelength filter to detect a magnitude of the beam after being filtered by the multiple spectral filtering characteristics of the differential wavelength filter; and
      a controller that modulates the tunable Fabry-Perot cavity to control a wavelength of the system in response to differences in magnitude of the filtered beam detected by the multi-element detector.

22. A semiconductor tunable laser system as claimed in claim 21, further comprising a cavity length modulator that modulates a length of the laser cavity over of a distance greater than a spacing between longitudinal cavity modes of the laser cavity.

23. A semiconductor tunable laser system as claimed in claim 21, wherein the differential wavelength filter system comprises a stepped etalon.

24. A semiconductor tunable laser system as claimed in claim 23, wherein the stepped etalon comprises one step.

25. A semiconductor tunable laser system as claimed in claim 23, wherein the stepped etalon comprises two steps.

26. A semiconductor tunable laser system as claimed in claim 21, further comprising a beam splitter outside of the laser cavity of the semiconductor laser that provides a portion of the output of the laser as the beam received by the differential wavelength filter system.

27. A process for tuning a semiconductor laser system, comprising:
   amplifying optical energy in a laser cavity with a semiconductor gain medium;
   selecting a wavelength of operation of the laser cavity by tuning a Fabry-Perot cavity within the laser cavity; and
   modulating an optical length of the laser cavity over of about one half of the wavelength of operation so that a longitudinal mode of the laser cavity resides at the wavelength of operation selected by the Fabry-Perot cavity.

28. A process as claimed in claim 27, further comprising:
   tuning the Fabry-Perot cavity to the wavelength of operation; and then
   modulating the optical length of the laser cavity so that the longitudinal mode of the laser cavity resides at the wavelength of operation.

29. A process as claimed in claim 27, wherein tuning the Fabry-Perot cavity comprises modulating an electric field to change a distance between a stationary partial reflector and a movable partial reflector.

30. A process as claimed in claim 27, wherein step of modulating the optical length of the laser cavity comprises moving a movable reflector defining one end of the laser cavity.

31. A process as claimed in claim 30, wherein step of moving the movable reflector comprises modulating an electric field between movable reflector and a stationary electrode to displace the movable reflector.

32. A process as claimed in claim 27, further comprising selecting a length of the laser cavity so that cavity mode spacing is greater than 3 GigaHertz.

33. A process as claimed in claim 27, further comprising selecting a length of the laser cavity so that cavity mode spacing is greater than 10 GigaHertz.

34. A semiconductor tunable laser system, comprising:
   a semiconductor chip functioning as a laser gain medium within a laser cavity;
   a tunable filter within the laser cavity for selecting a wavelength of operation of the laser system; and
   a cavity length modulator that modulates an optical length of the laser cavity;
   a filter driver for generating a control voltage applied to the tunable filter;
   a modulator driver for generating a voltage applied to the cavity length modulator; and
   a microprocessor for controlling the filter driver and the modulator driver.

35. A semiconductor tunable laser system as claimed in claim 34, further comprising a proximity detector for determining a cavity length of the tunable filter.

36. A semiconductor tunable laser system as claimed in claim 35, wherein the proximity detector detects a capacitance between a membrane and stationary electrode of the tunable filter.

37. A semiconductor tunable laser system as claimed in claim 34, further comprising wavelength to proximity mapper that correlates the detected cavity length to passband of the tunable filter.

* * * * *